United States Patent [19]
Yamamoto et al.

[11] Patent Number: 6,143,622
[45] Date of Patent: Nov. 7, 2000

[54] METHOD FOR FORMING ALIGNMENT MARK

[75] Inventors: Yasuhiro Yamamoto; Akira Watanabe, both of Tokyo, Japan

[73] Assignee: Oki Electric Industry Co., Ltd., Tokyo, Japan

[21] Appl. No.: 09/478,805

[22] Filed: Jan. 7, 2000

[30] Foreign Application Priority Data

Jan. 14, 1999 [JP] Japan .................................. 11-008115

[51] Int. Cl.⁷ .................................................. H01L 21/76
[52] U.S. Cl. .......................... 438/401; 438/401; 438/462; 438/800; 257/797
[58] Field of Search .................... 438/401, 462, 438/800; 257/797, 798

[56] References Cited

U.S. PATENT DOCUMENTS 5,786,260  7/1998  Jang et al. ............................... 438/401

OTHER PUBLICATIONS

"The Science of CMP" at pp. 299–303 and pp. 327–337 published by Science Forum on Aug. 20, 1997.

*Primary Examiner*—Charles Bowers
*Assistant Examiner*—Craig Thompson
*Attorney, Agent, or Firm*—Junichi Mimura

[57] ABSTRACT

A method for forming an alignment mark includes defining a circuit pattern area and an alignment mark area on a semiconductor substrate, forming a first pattern in the alignment mark area, forming a second pattern of a first material on the first pattern, forming a layer of a second material different from the first on the entire surface of the semiconductor substrate, and polishing the layer of the second material and the second layer such that the second pattern and the layer of second material are polished at different speed, until a step difference appears between the second pattern and the layer.

22 Claims, 6 Drawing Sheets

METHOD FOR FORMING ALIGNMENT MARK

CROSS REFERENCE TO RELATED APPLICATION

This application claims the priority benefit of Japanese Patent Application No. 11-008115, filed Jan. 14, 1999, the entire subject matter of which is incorporated herein of reference.

BACKGROUND OF THE INVENTION

1. Field of the Invention

The invention relates to a method for forming an alignment mark by utilizing a CMP (Chemical Mechanical Polishing) process.

2. Description of the Related Art

Conventionally, the manufacture of a semiconductor device includes repeated transfers of circuit patterns, which is formed on a mask, to a resist film formed on a Si-substrate.

In a lithographic process during the steps, a lithographic device detects a location of an alignment mark formed on the Si-substrate due to let the mask overlay the resist film accurately in a desired position. After, the mask is positioned in the desired position, a lithographic process is performed.

In recent years, a stepping projection aligner is used in a lithographic process because of requirements for shrinking the size of the semiconductor device. In FIGS. 4A and 4B, alignment marks 52a, which are used in a stepping projection aligner, are illustrated. The alignment marks 52a are formed in an alignment area of a Si-substrate 50. As the alignment marks 52a are formed with circuit patterns 52b simultaneously, the alignment marks 52a and the circuit patterns 52b have the same thickness. Then, an insulating layer 54 is formed on the entire surface of the Si-substrate 50, the circuit patterns 52b and the alignment marks 52a. It is difficult to detect the edges of the alignment marks 52a because the edges are covered by the insulating layer 54. However, a lithographic device can be used to detect edges 60, 61, 62, 63 surrounding the alignment marks in plan view of a step difference in the insulating layer 54 in order to align the mask. In particularly, the device detects light scattering diffracting at the edges 60, 61, 62, 63, which serve to define the location of the alignment mark.

A method of measuring the accuracy of overlay of the mask on the Si-substrate is explained below. A resist film is formed on the insulating layer 54. Then, a mask is aligned by detecting the edges 60, 61, 62, 63, and the resist film is exposed to the light through the mask. After the resist film is developed, a frame-shaped resist pattern 56, which surrounds the edges 60, 61, 62, is formed on the insulating layer 54, as shown in FIG. 4C. According to design, the distance Xa between the frame shaped pattern 56 and the edge 60 equals the distance Xb between the frame-shaped pattern 56 and the edge 61. Also, according to design, the distance Ya between the frame-shaped pattern 56 and the edge 62 equals the distance Yb between the frame-shaped pattern 56 and the edge 63. Therefore, the deviation in alignment of the mask in the horizontal direction is calculated as Xa–Xb, and the deviation in alignment of the mask in the vertical direction is calculated as Ya–Yb. If the result of the calculation is out of a range in which the circuit works satisfactorily, the lithographic process should be performed again. If the result of the calculation is in the range, the next process can be performed.

However, the step difference that appears in the insulating layer 54 sometimes causes a metalized wiring layer formed later in the circuit pattern area, to break when the semiconductor device is shrunk by reducing a distance between elements to be connected to each other by the metalized wiring layer. Therefore, as shown in FIG. 5, it is required that the surface of the insulating layer is planarized by a CMP (Chemical Mechanical Polishing) process. However, as the step difference caused by the alignment mark 52a is not appeared on the planarized surface of the insulating layer 54, a lithographic device cannot recognize the location of the edge of the alignment mark 52a when the metalized wiring layer is formed on the planarized surface of the insulating layer 54. Therefore, a mask can not be overlaid accurately over the semiconductor device in the desired location.

SUMMARY OF THE INVENTION

An objective of the invention is to resolve the above-described problem and to provide a method for forming an alignment mark includes defining a circuit pattern area and an alignment mark area on a semiconductor substrate, forming a first pattern in the alignment mark area, forming a second pattern of a first material on the first pattern, forming a layer of a second material different from the first on the entire surface of the semiconductor substrate, and polishing the layer of the second material and the second layer such that the second pattern and the layer of second material are polished at different speed, until a step difference appears between the second pattern and the layer.

BRIEF DESCRIPTION OF THE DRAWINGS

The invention will be more particularly described with reference to the accompanying drawings in which.

DETAILED DESCRIPTION OF THE PREFERRED EMBODIMENTS

Figure 1A:
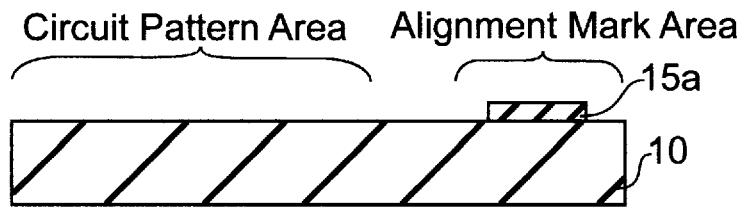
FIG. 1A through 1F are sequential sectional views for forming an alignment mark of a first embodiment of the invention.

First, referring to FIG. 1A, a circuit pattern area and an alignment mark area are defined in a Si-substrate 10. An unillustrated thermal oxide layer having a thickness of 5–10 nm is formed on the Si-substrate 10, and then, an SiN (silicon nitride) layer having a thickness of around 200 nm is formed by CVD on the thermal oxide layer in the alignment mark area. Next, a rectangularly-shaped first pattern 15a of SiN is formed in the alignment mark area by etching the SiN layer.

Figure 1B:
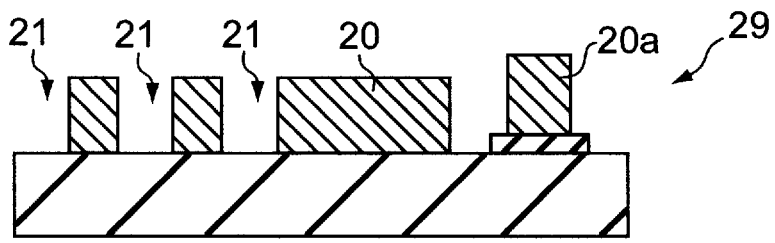

After that, referring to FIG. 1B, a CVD Silicon Oxide (SiO$_2$) layer 20 having a thickness of around 500 nm, is formed on the entire surface of the Si-Substrate 10. Then, by etching the CVD SiO$_2$ layer 20, contact hole patterns 21 are formed in the circuit pattern area, and second patterns 20a of the CVD SiO$_2$ are formed on the first pattern 15a in the alignment mark area. Unillustrated diffusion layers are formed at the exposed surface of the Si-Substrate 10 in the contact holes 21. Each second pattern 20a is square and has approximately the same size. Further, the second patterns 20a are disposed in a line. The alignment mark 29 consists of the first pattern 15a and the second pattern 20a. It is required to form the second pattern 20a to have a particular size so that the lithographic device can recognize the alignment location. Further, the size of the first pattern 15a is larger than the second pattern 20a. More specifically, the size of the first pattern 15a is designed according to the following formula:

Length of longer side $\geq (A \times n + B \times (n-1) + C \times 2)\mu m$

Length of shorter side $\geq (A + C \times 2)\mu m$, where n is the number of second patterns 20a, A is the length of each side of the second pattern 20a, B is the distance between the second patterns 20a, and C is the distance between the edge of the first pattern 15a and the edge of the second pattern 20a. For example, if A=B=5 $\mu m$, n=3 and C=1 m, then the first pattern 15a having a longer side of 27 $\mu m$ and a shorter side of at least 7 $\mu m$ is formed.

Figure 1C:
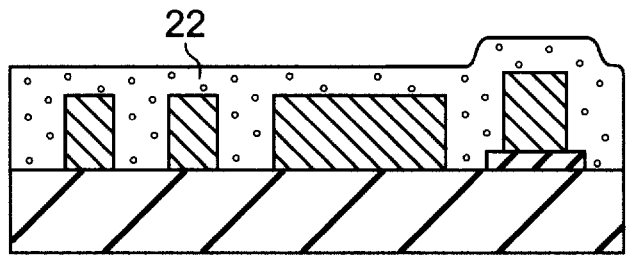

Next, referring to FIG. 1C, a metalized multi-layer 22 including a Titanium nitride (TiN) layer, 30 nm thick, and a Tungsten (W) layer 300 nm thick is formed on the entire surface of the Si-substrate 10. After that, the multi-layer 22 is polished by the CMP process. Details of the CMP process is disclosed in the publication, "The Science of CMP" at pp. 299–303, and pp. 327–337 published by Science Forum on Aug. 20, 1997. According to the publication, when a CMP slurry having an oxidizing agent is used for the CMP process, a speed that a W layer is polished is faster than that of an oxidized layer. Further, it also discloses that a polishing rate (W layer/oxidized layer) is 120. Furthermore, according to the publication, the surface of a W layer is easily oxidized by an oxidizing agent. While tungsten is a very firm material, oxidized tungsten is very fragile. Therefore, oxidized tungsten can be removed very fast by an abrasive including alumina (Al$_2$O$_3$). The W layer can be polished by the CMP process by the repetition of a process for oxidizing the W layer by the oxidizing agent and a process for removing the oxidized tungsten by the abrasive.

Figure 1D:
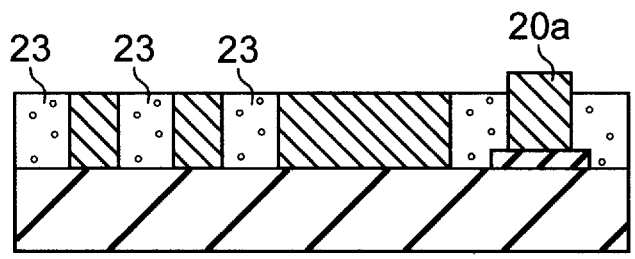

Referring to FIG. 1D, when the surface of the multi-layer 22 is polished by the CMP process using the slurry that includes hydrogen peroxide as the oxidizing agent, until the surface of the CVD SiO$_2$ layer 20 in the circuit pattern area is exposed, the upper part of the second pattern 20a is projecting from the planarized surface which is polished by CMP because the speed that the multi-layer 22 including the W layer is polished is faster than that of the second pattern 20a formed of SiO$_2$. After the polishing, a tungsten plug 23 is formed in each contact hole 21 to make a connection with the diffusion layer in the Si-substrate 10.

Figure 1E:
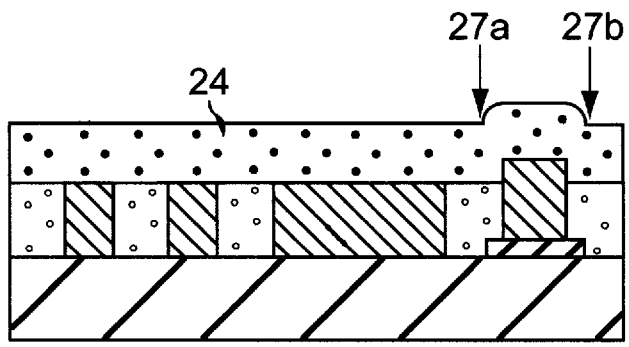

After that, referring to FIG. 1E, an aluminum wiring layer 24, 500 nm thickness, is formed on the entire surface. As the second pattern 20a projects, the aluminum wiring layer 24 on the second pattern 20a also projects. That is, the step difference can be formed in the aluminum wiring layer 24. Therefore, in a process of patterning the aluminum layer 24, the aligner can detect the edge 27a of the step difference of the aluminum layer 24 so that the mask can be aligned in a desired position.

Figure 6:
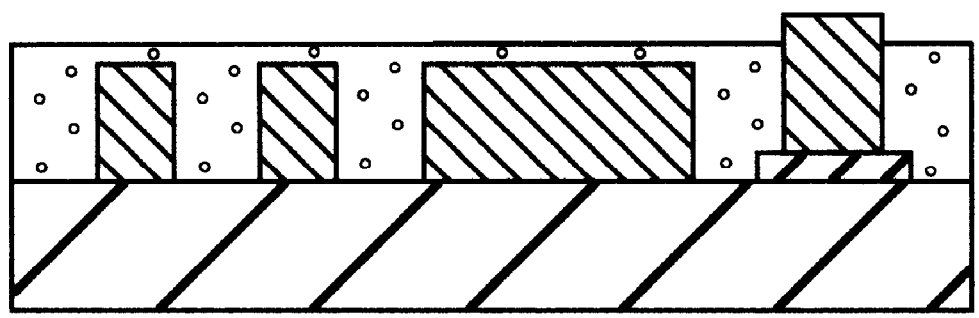
FIG. 6 is a sectional view for forming an alternative alignment mark of the first embodiment of the invention.

In the first embodiment, the multi-layer 22 is polished until the surface of the CVD SiO$_2$ layer 20 in the circuit pattern area is exposed. However, as shown in FIG. 6, it is possible to leave the multi-layer 22 on the CVD SiO$_2$ layer 20 if the second pattern 20a projects from the planarized surface of the multi-layer 22. In this case, the multi-layer 22 is used for not only the tungsten plug, but also for a connecting wire. Therefore, by detecting the edge of the second pattern 20a, the patterning process is performed on the multi-layer 22 in the circuit area. When the multi-layer 22 is to be used for the connecting wire, the first pattern 15a should be thick because the thick multi-layer 22 can be left on the CVD SiO$_2$ layer 20. Further, iron nitrate or potassium peroiodate can be used for the oxidizing agent.

Figure 2A:
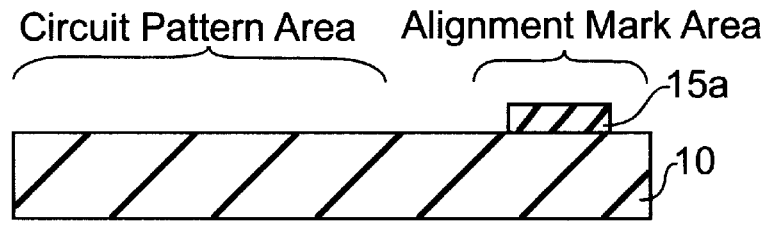
FIG. 2A is through 2E are sequential sectional views for forming an alignment mark of a second embodiment of the invention.

Referring to FIG. 2A, a circuit pattern area and an alignment mark area are defined in a Si-substrate 10. An unillustrated thermal oxide layer having a thickness of 5–10 nm is formed on the Si-substrate 10, and then, an SiN (silicon nitride) layer having a thickness of around 200 nm is formed by CVD on the thermal oxide layer in the alignment mark area. Next, a rectangularly-shaped first pattern 15a of SiN is formed in the alignment mark area by etching the SiN layer.

Figure 2B:
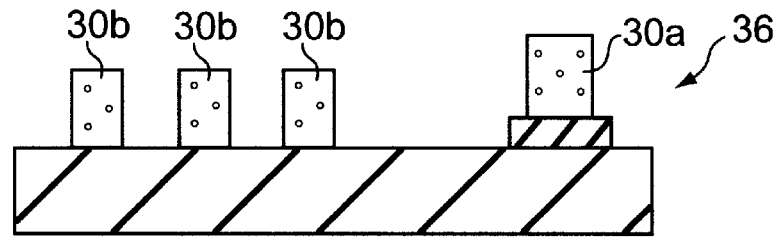

After that, referring to FIG. 2B, a metalized multi-layer including a Titanium nitride (TiN) layer, 30 nm thick, and a Tungsten (W) layer, 300 nm thick, is formed on the entire surface of the Si-substrate 10. After that, by a lithographic process, a wiring patterns 30b is formed on the Si-substrate 10 in the circuit pattern area, and second patterns 30a are formed on the first pattern 15a in the alignment mark area, simultaneously. The alignment mark 36 consists of the first pattern 15a and the second pattern 30a. The size and the shape of the first and second patterns are determined in the same way which is described in the first embodiment.

Figure 2C:
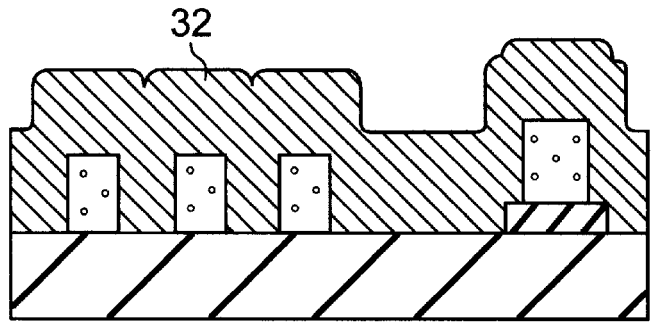
Figure 2D:
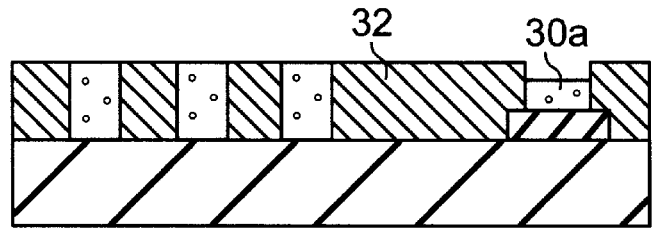

Next, referring to FIG. 2C, a CVD Silicon Oxide (SiO$_2$) layer 32 having a thickness of around 700 nm is formed on the entire surface. After that, referring to FIG. 2D, the CVD SiO$_2$ layer 32 is polished by CMP to planarize the surface in the circuit pattern area until the surface of the wiring pattern 30b is exposed. As described above, when the CVD SiO$_2$ layer 32 is polished by CMP using the slurry that includes a hydrogen peroxide until the surface of the wiring pattern 30b is exposed, the surface of the second pattern 30a is caved from the surface of the CVD SiO$_2$ layer 32 because the speed that the second pattern 20a formed of tungsten is polished, is faster than that of the CVD SiO$_2$ layer 32.

Figure 2E:
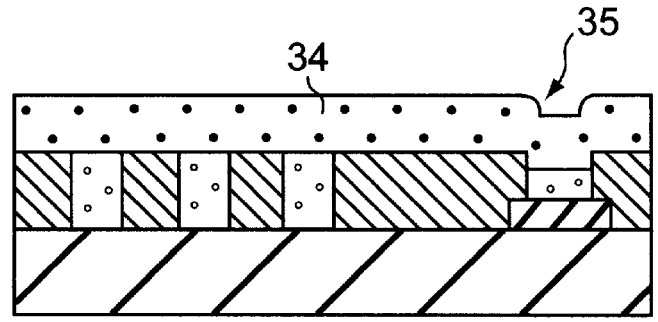

After that, referring to FIG. 2E, an aluminum wiring layer 34 having a thickness of around 500 nm is formed on the entire surface. Then, as the step difference is appeared on the aluminum wiring layer 34, the aligner can detect the edge 35 of the step difference of the aluminum layer 34 in a process of patterning the aluminum layer 34, so that the mask can be aligned in a desired position.

In the second embodiment, the CVD SiO$_2$ layer 32 is polished by CMP until the surface of the wiring pattern 30b is exposed because the aluminum wiring layer 34 is formed directly on the wiring pattern 30b. However, it is possible to leave the CVD SiO$_2$ layer 32 on the wiring pattern 30b if the second pattern 30a is caved from the planarized surface of the CVD SiO$_2$ layer 32. When some contact holes are formed in the CVD SiO$_2$ layer 32, an edge of the step difference appeared on a resist film which is formed on the entire surface can be used for aligning the mask. If the thick CVD SiO$_2$ layer 32 is required on the wiring pattern 30b, the first pattern 15a should be thick.

In the second embodiment, although the aluminum layer 34 is connected to the second pattern 30a, the aluminum layer 34 is not electrically connected to the Si-substrate 10 through alignment mark 36 because the first pattern 15a is formed of the insulating material. Furthermore, in the process for patterning aluminum layer, when the aluminum layer 34 formed in the alignment mark area is isolated from the aluminum layer 34 formed on the circuit pattern area, and an insulating layer is formed thereon, the Si-substrate 10 is completely isolated from the aluminum layer 34 formed in the alignment area.

Furthermore, as a step difference can be appeared in the alignment mark if the speed that the second pattern is polished is different from that of a layer formed thereon, a layer that the Si-substrate 10 is oxidized, a CVD SiN layer or a CVD-BPSG (Boron Phosphor Silicate Glass) layer can be used in the first and second embodiment, instead of the CVD $SiO_2$ layer. Also, the first pattern 15b may be formed of other insulating material or metal. If the first pattern 15b is formed of metal, the aluminum layer 24 or 34 in the alignment mark area should be isolated from the aluminum layer 24 or 34 in the circuit pattern area to avoid an unnecessary connection to the Si-substrate 10.

Furthermore, the multi-layer 22 described in the first embodiment and the second pattern 30a described in the second embodiment may be formed of aluminum or copper. According to the publication mentioned before, the CMP rate (aluminum layer/oxidized layer) is the range between 30 to 100. Additionally, the concept of the invention can be used for a method for forming an alignment mark formed on an insulating layer.

Further, the height of the step difference appeared on the layer which is formed on the second pattern 15a or 20a can be controlled by process conditions including a polishing pad hardness in addition to the polishing speed using a slurry and an abrasive.

Figure 1F:
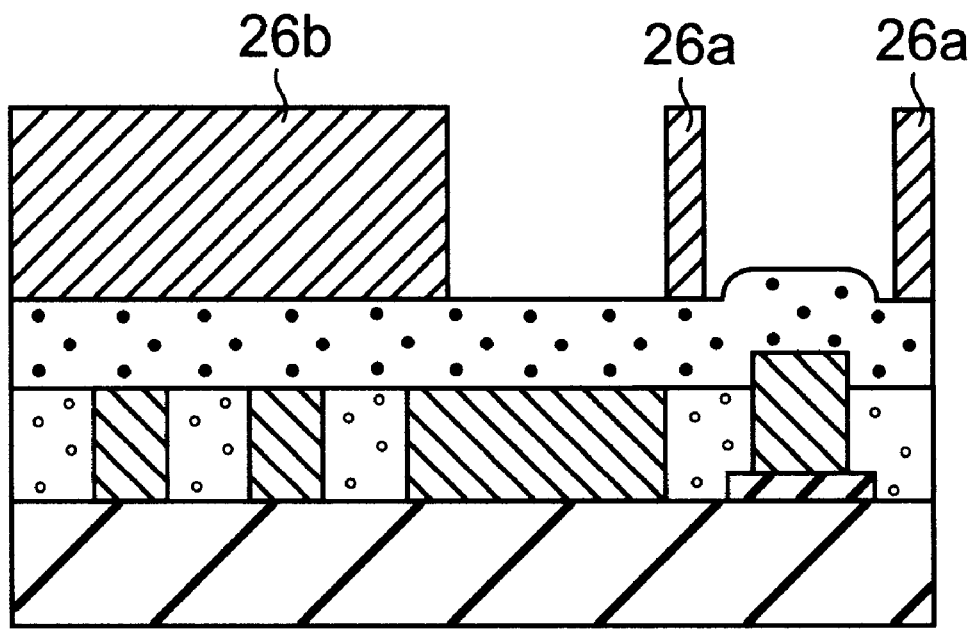
Figure 3:
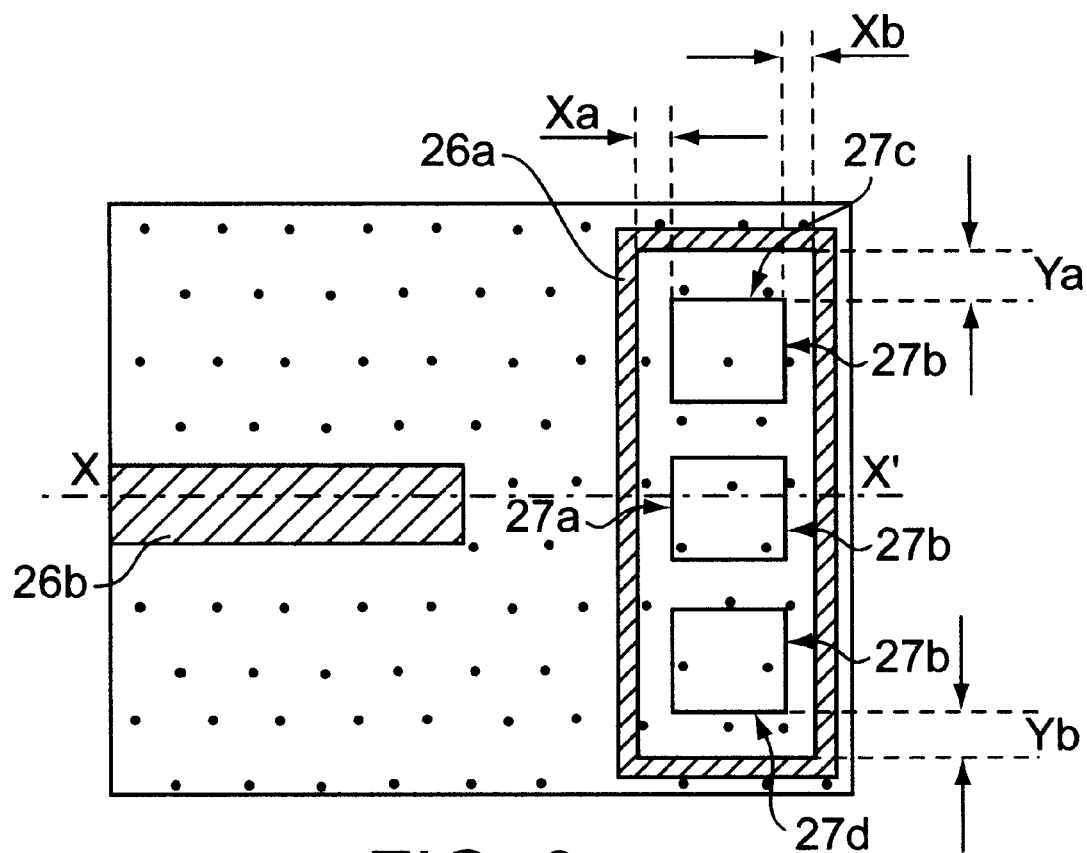
FIG. 3 is a plan view of FIG. 1F.
Figure 4A:
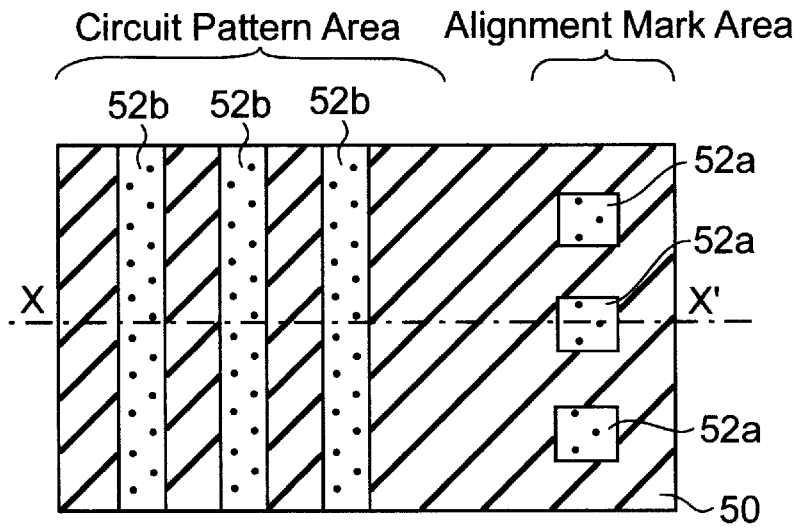
FIG. 4A is a plan view of a conventional alignment mark formed on a semiconductor device.
Figure 4B:
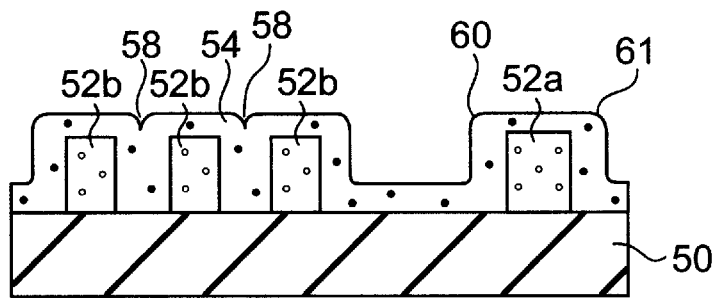
FIG. 4B is a sectional view taken along line X–X' shown in FIG. 4A.
Figure 4C:
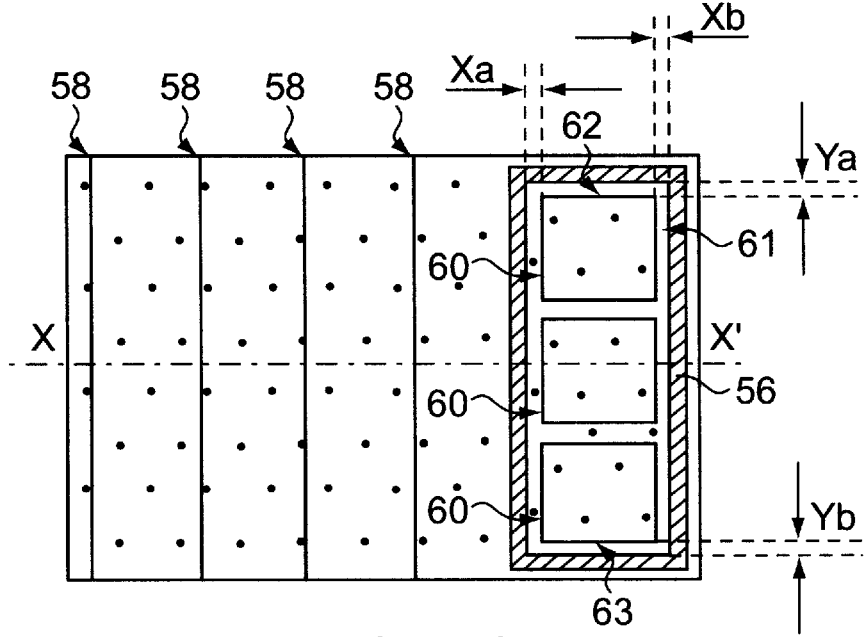
FIG. 4C is a plan view of a conventional alignment mark formed on a semiconductor device after forming a frame-shaped pattern for measuring an accuracy of overlay of a mask.
Figure 5:
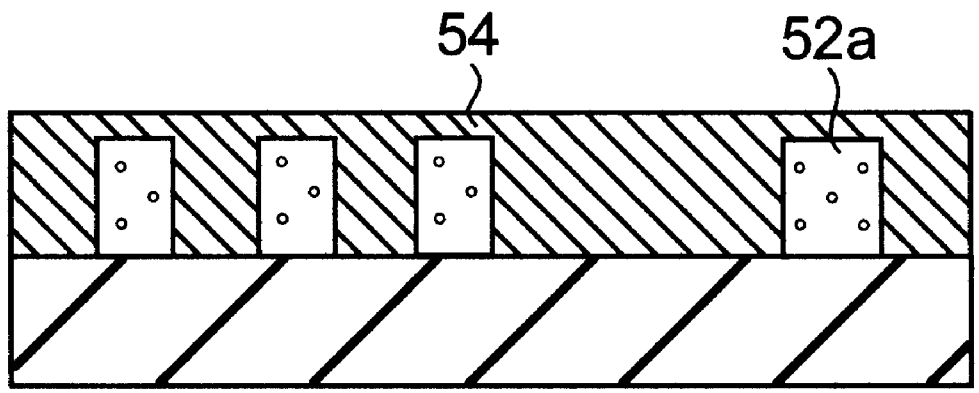
FIG. 5 is a sectional view of a conventional alignment mark having a planarized insulating layer.

In the first embodiment, the accuracy of overlay of the mask is measured by the following process. Referring to FIG. 1F and FIG. 3, a resist film is formed on the entire surface of the aluminum wiring layer 24. Then, by a lithographic process, a frame-shaped pattern 26a, which surrounds the edges 27a, 27b, 27c, 27d of the step difference appeared on the aluminum layer 24, is formed in the alignment area, and a resist pattern 26b is formed in the circuit pattern area. According to design, the distance Xa between the frame-shaped pattern 26a and the edge 27a of the step difference formed on the aluminum layer 24 equals the distance Xb between the frame-shaped pattern 26a and the edge 27b as designed. Also, according to design, the distance Ya between the frame-shaped pattern 26a and the edge 27c equals the distance Yb between the frame-shaped pattern 26a and the edge 27d. Therefore, the deviation in alignment of the mask in the horizontal direction is calculated as Xa–Xb, and the deviation in alignment of the mask in the vertical direction is calculated as Ya–Yb. As decried above, the next process is determined by the result of the calculation.

While the invention has been described with reference to illustrative embodiments, this description is not intended to be construed in a limiting sense. Various modifications of the illustrated embodiments, as well as other embodiments of the invention, will be apparent to those skilled in the art on reference to this description. Therefore, the appended claims are intended cover any such modifications or embodiments as fall within the true scope of the invention.

What we claim is:

1. A method for forming an alignment mark, comprising:
    defining a circuit pattern area and an alignment mark area on a semiconductor substrate;
    forming a first pattern within the alignment mark area;
    forming a second pattern of first material on the first pattern;
    forming a layer of second material different from the first material on an entire surface of the semiconductor substrate; and
    polishing the layer of the second material and the second pattern such that the second pattern and the layer of second material are polished at different speed, until a step difference appears between the second pattern and the layer of second material.

2. A method for forming an alignment mark as claimed in claim 1, wherein the polishing includes polishing by a CMP process.

3. A method for forming an alignment mark as claimed in claim 2, wherein the speed that the second pattern is polished is faster than that of the layer of second material.

4. A method for forming an alignment mark as claimed in claim 2, wherein the speed that the second pattern is polished is slower than that of the layer of second material.

5. A method for forming an alignment mark as claimed in claim 3, wherein the forming a second pattern includes forming a second pattern of oxidized material, the second material includes tungsten, and the CMP process uses an oxidizing agent.

6. A method for forming an alignment mark as claimed in claim 5, wherein the oxidizing agent is hydrogen peroxide, iron nitrate or potassium peroiodate.

7. A method for forming an alignment mark as claimed in claim 4, wherein the first material includes tungsten, the forming a layer includes a forming a layer of oxidized material, and the CMP process uses an oxidizing agent.

8. A method for forming an alignment mark as claimed in claim 5, wherein the oxidizing agent is hydrogen peroxide, iron nitrate or potassium peroiodate.

9. A method for forming an alignment mark, comprising:
    defining a circuit pattern area and an alignment mark area on a semiconductor substrate;
    forming a first pattern within the alignment mark area;
    forming a first layer of a first material on an entire surface of the semiconductor substrate;
    forming a second pattern on the first pattern in the alignment mark area by etching the first layer, and forming a contact hole in the first layer by etching the first layer;
    forming a second layer of a second material different from the first material on an entire surface of the semiconductor device, and
    polishing the second layer and the second pattern by a CMP process such that the first and the second material are polished at different speed, until a step difference appears between the second layer and the second pattern.

10. A method for forming an alignment mark as claimed in claim 9, wherein the speed that the second pattern is polished is slower than that of the second layer.

11. A method for forming an alignment mark as claimed in claim 9, wherein the forming a second pattern includes forming a second pattern of an insulating material, the second material includes metal, and the CMP process uses an oxidizing agent.

12. A method for forming an alignment mark as claimed in claim 9, wherein the insulating material is oxidized material, the metal includes tungsten.

13. A method for forming an alignment mark as claimed in claim 10, wherein the polishing the second layer includes polishing the second layer until the first layer is exposed.

14. A method for forming an alignment mark as claimed in claim 13, further comprising, forming a wiring layer on the exposed surface of the first layer, on the second pattern and on the second layer in the contact hole, wherein a step difference is appeared in the wiring layer because a step difference is formed between the second pattern and the second layer, and patterning the wiring layer by detecting an edge of the step difference appeared in the wiring layer.

15. A method for forming an alignment mark as claimed in claim 10, wherein the polishing the second layer includes polishing the second layer until the first layer is not exposed, and further comprising, patterning a second layer by detecting an edge of the second pattern.

16. A method for forming an alignment mark, comprising:

defining a circuit pattern area and an alignment mark area on a semiconductor substrate;

forming a first pattern within the alignment mark area;

forming a first layer of a first material on an entire surface of the semiconductor substrate;

forming a second pattern on the first pattern in the alignment mark area by etching the first layer, and forming a wiring pattern by etching the first layer;

forming a second layer of a second material different from the first material an entire surface of the semiconductor substrate, and polishing the second layer and the second pattern by a CMP process such that the first and the second material are polished at different speed, until a step difference appears between the second layer and the second pattern.

17. A method for forming an alignment mark as claimed in claim 16, wherein the speed that the second pattern is polished is faster than that of the second layer.

18. A method for forming an alignment mark as claimed in claim 16, wherein the second material includes metal, the forming a second layer includes forming a second layer of an insulating material, and the CMP process uses an oxidizing agent.

19. A method for forming an alignment mark as claimed in claim 18, wherein the insulating material is oxidized material, the metal includes tungsten.

20. A method for forming an alignment mark as claimed in claim 17, wherein the polishing the second layer includes polishing the second layer until the first layer is exposed.

21. A method for forming an alignment mark as claimed in claim 20, further comprising, forming a wiring layer on the exposed surface of the second layer, on the second pattern and on the wiring pattern, wherein a step difference is appeared in the wiring layer because a step difference is formed between the second pattern and the second layer, and patterning the wiring layer by detecting an edge of the step difference appeared in the wiring layer.

22. A method for forming an alignment mark as claimed in claim 17, wherein the polishing the second layer includes polishing the second layer until the first layer is not exposed, and further comprising, patterning a second layer by detecting an edge of the second pattern.

* * * * *